(12) United States Patent
Deak

(10) Patent No.: US 7,196,882 B2
(45) Date of Patent: Mar. 27, 2007

(54) MAGNETIC TUNNEL JUNCTION DEVICE AND ITS METHOD OF FABRICATION

(75) Inventor: James G. Deak, Boise, ID (US)

(73) Assignee: Micron Technology, Inc., Boise, ID (US)

(*) Notice: Subject to any disclaimer, the term of this patent is extended or adjusted under 35 U.S.C. 154(b) by 360 days.

(21) Appl. No.: 10/200,512

(22) Filed: Jul. 23, 2002

(65) Prior Publication Data

US 2004/0017639 A1    Jan. 29, 2004

(51) Int. Cl.
*G11B 5/39* (2006.01)

(52) U.S. Cl. .................................. 360/324.2

(58) Field of Classification Search ............. 360/324.2; 365/171, 173, 55, 97, 98, 100, 232; 257/421; 338/32 R; 324/207.21, 252
See application file for complete search history.

(56) References Cited

U.S. PATENT DOCUMENTS

| | | | |
|---|---|---|---|
| 5,408,377 A * | 4/1995 | Gurney et al. | 360/325 |
| 5,650,958 A | 7/1997 | Gallagher et al. | |
| 5,764,567 A * | 6/1998 | Parkin | 365/173 |
| 5,768,069 A * | 6/1998 | Mauri | 360/314 |
| 5,768,181 A | 6/1998 | Zhu et al. | |
| 5,841,692 A | 11/1998 | Gallagher et al. | |
| 5,966,012 A | 10/1999 | Parkin | |
| 6,166,948 A | 12/2000 | Parkin et al. | |
| 6,178,074 B1 * | 1/2001 | Gill | 360/324.2 |
| 6,185,080 B1 | 2/2001 | Gill | |
| 6,211,559 B1 | 4/2001 | Zhu et al. | |
| 6,259,586 B1 * | 7/2001 | Gill | 360/324.2 |
| 6,275,363 B1 * | 8/2001 | Gill | 360/324.2 |
| 6,341,053 B1 * | 1/2002 | Nakada et al. | 360/324.2 |
| 6,449,134 B1 * | 9/2002 | Beach et al. | 360/324.12 |
| 6,611,405 B1 * | 8/2003 | Inomata et al. | 360/324.2 |
| 6,621,664 B1 * | 9/2003 | Trindade et al. | 360/318 |
| 6,750,068 B1 * | 6/2004 | Chen | 438/3 |
| 6,765,768 B1 * | 7/2004 | Saito | 360/319 |
| 6,781,798 B1 * | 8/2004 | Gill | 360/314 |
| 6,822,838 B1 * | 11/2004 | Lin et al. | 360/324.2 |
| 6,891,703 B1 * | 5/2005 | Hasegawa | 360/324.11 |
| 6,982,854 B1 * | 1/2006 | Kawawake et al. | 360/324.1 |

OTHER PUBLICATIONS

F. Montaigne, et al., Enhanced Tunnel Magnetoresistance at High Bias Voltage in Double-Barrier Planar Junctions, *Appl. Phys. Lett.*, vol. 73, No. 19, Nov. 9, 1998, pp. 2829-2831.

K. Inomata, et al., Double Tunnel Junctions for Magnetic Random Access Memory Devices, *J. Appl. Phys.*, vol. 87, No. 9, May 1, 2000, pp. 6064-6066.

* cited by examiner

*Primary Examiner*—Angel Castro
(74) *Attorney, Agent, or Firm*—Dickstein Shapiro LLP (57) ABSTRACT

The present invention provides a magnetic tunnel junction memory element comprising two pinned ferromagnetic layers having magnetic orientations pointing in opposite directions and a sense layer arranged between the two pinned ferromagnetic layers and separated from each by a nonmagnetic tunnel barrier layer. The invention also provides methods of fabricating magnetic tunnel junction memory elements as well as magnetoresistive memory devices and processor systems comprising such memory elements.

60 Claims, 7 Drawing Sheets

MAGNETIC TUNNEL JUNCTION DEVICE AND ITS METHOD OF FABRICATION

FIELD OF THE INVENTION

This invention relates generally to magnetic tunnel junction ("MTJ") devices and, more particularly, to those having double tunnel junctions.

BACKGROUND OF THE INVENTION

Integrated circuit designers have always sought the ideal semiconductor memory: a device that is randomly accessible, can be written or read very quickly, is non-volatile, and consumes little power. Magnetoresistive random access memory (MRAM) technology has been increasingly viewed as offering all these advantages.

One form of magnetic memory element for an MRAM has a structure that includes ferromagnetic layers separated by a non-magnetic barrier layer that forms a tunnel junction. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "antiparallel" states relative to the pinned layer. In response to parallel and antiparallel states, the magnetic memory element represents two different resistance states, which are read by the memory circuit as either a "1" or a "0." It is the detection of these resistance states for the different magnetic orientations that allows the MRAM to read information.

Detection can be achieved by passing a current or bias voltage through the tunnel junction device in a direction perpendicular to the planes of the layers. The nonmagnetic insulating barrier layer that separates the pinned and free layers is thin enough that quantum mechanical tunneling occurs between the pinned and free layers. This tunneling is electron spin dependent, so that the directions of the magnetic moments of the pinned and free layers relative to each other affect the electron tunneling. When the magnetic orientation of the free layer changes, electron tunneling, and thus resistance, also changes. Specifically, when the relative orientations of the free and pinned layers become parallel, electron tunneling increases and the resistance decreases. When the orientations become antiparallel, electron tunneling decreases and the resistance increases. As the current is conducted through the element, the changes in resistance are manifested as potential changes and processed as a signal. The resistance change can also be expressed as a ratio of the change in resistance to the maximum resistance, or tunneling magnetoresistance ("TMR") ratio.

One of the drawbacks of a memory element having a single magnetic tunnel junction as described above is a dramatic decrease in TMR with increased bias voltage. The decrease or decay in TMR results in a low cell signal and thus, difficulty in reading or sensing the state stored in the cell.

Figure 2:
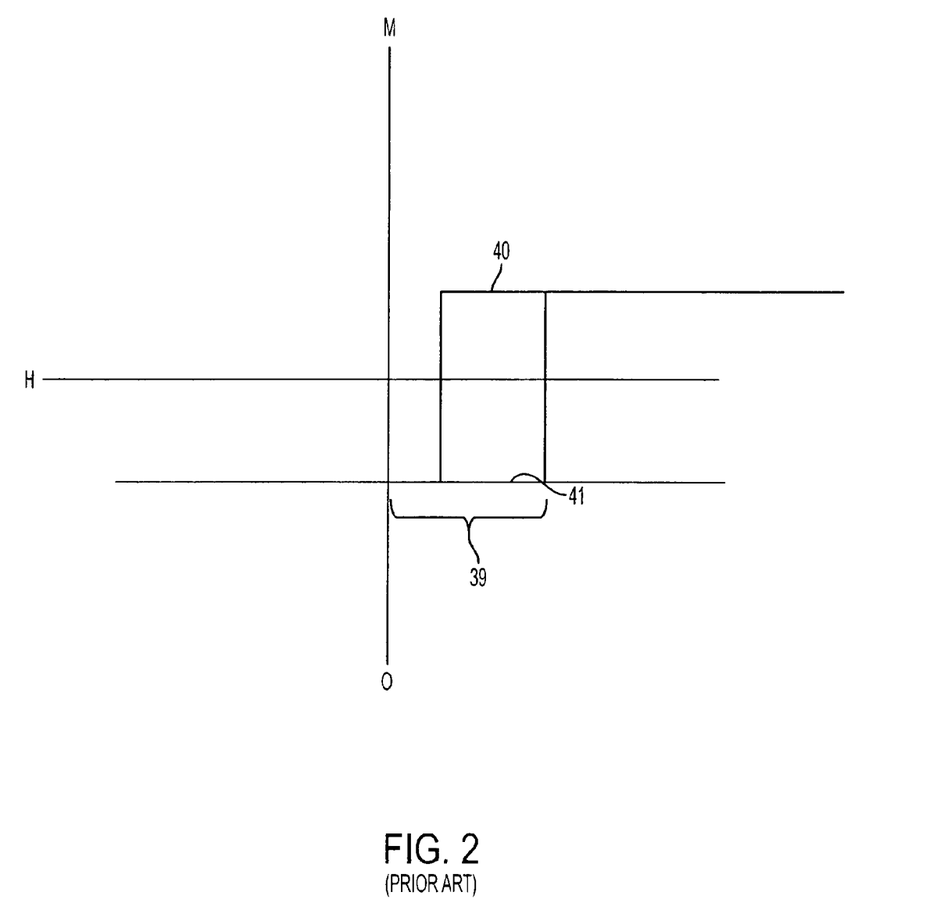
FIG. 2 is a simplified diagram of a hysteresis loop illustrating the problem of offset that occurs in the prior art.

In addition, when a multilayered memory device is scaled down, numerous other problems can occur. For example, magnetostatic or dipolar coupling can occur between the pinned ferromagnetic layer and the free ferromagnetic, or sense layer. This coupling is due to the dipolar or stray fields of the ferromagnetic layers. When there is significant stray field from a pinned layer, the magnetostatic interaction between the pinned layer and free layer favors an antiparallel orientation in the layers' respective magnetic moments, resulting in an offset switch field at the free layer. In such a case, a hysteresis loop of the free or sense layer becomes offset from zero magnetic field. The offset field thus creates a situation in which a different write current is required to switch the magnetic moment in the sense layer from one state than is required to switch it from the other state. Write current would then need to be driven at the higher current at all times. This makes operation of the MTJ device difficult and leads to excessive power consumption. As these fields become larger with greater scale down, the problem exacerbates. In a more extreme but more important case, the bit cannot be written. Such a situation is illustrated in FIG. 2, in which the hysteresis loop indicates an offset 39. When the write field is set back to zero, the bit always magnetizes in direction 41 as opposed to direction 40.

Stray fields emanating from the free ferromagnetic layer also create operation difficulties in scale down. These stray fields interact with the free layers in neighboring bits arranged in an array, thus potentially causing inaccuracies in writing. Such fields therefore limit the density capabilities of an MRAM device.

Moreover, as lateral dimensions of the MTJ are reduced, the volume of each of the magnetic layers also decreases. This decrease in magnetic volume increases the possibility that "super-paramagnetic" behavior will occur. Super-paramagnetic behavior refers to a situation in which thermal fluctuations cause the magnetic moment of a magnetic entity to spontaneously rotate if the magnetic anisotropy of the entity, which is proportional to its volume, is not sufficiently great. Thus, thermal fluctuations can interfere with the operation or stability of the sense layer. As the super-paramagnetic limit is approached, data retention time is also reduced.

Devices having two tunnel junctions in a multiplanar orientation ("double tunnel junctions"), have been proposed to decrease the decay of TMR that occurs with increased bias voltage and to potentially increase the magnitude of the resistance change as the sense layer is reversed. In a double tunnel junction device, the decreased reduction in TMR with increasing bias voltage results because two barriers are biased in series. The voltage drop across each junction is effectively cut in half Likewise, the fact that two junctions are biased in series doubles the magnitude of the resistance change (not the percent change) between the low and high resistance states. Double tunnel junctions have been described which have two pinned layers pinned in the same direction, but such arrangements cause a large offset field at the sense layer. Other multilayer junction devices having one insulating layer and one conducting layer have been described in which two pinned ferromagnetic layers have fields pinned in opposite directions. Such devices cancel the offset field at the sense layer and may result in decreased power consumption but do not achieve substantially increased resistance change over other single tunnel junction devices.

There is thus a need in the art for a single MTJ memory element which mitigates the above disadvantages.

SUMMARY OF THE INVENTION

The present invention provides a magnetic tunnel junction memory element useful in MRAM and magnetic read head applications. In a preferred embodiment, a memory element of the invention comprises two pinned ferromagnetic layers, the magnetic orientations of the layers pointing in opposite directions, and a sense layer stacked between the pinned layers and separated from each by an insulating tunnel layer. In a particularly preferred embodiment, the sense layer is a synthetic ferrimagnet having two ferromagnetic free layers separated by a spacer layer. The ferromagnetic free layers of the synthetic ferrimagnet have magnetic moments oppositely directed and unequal in magnitude.

The invention further provides methods of fabricating the memory element described in the preceding paragraph, as well as MRAM devices and processor systems containing the memory element.

These and other features and advantages of the invention will be more clearly understood from the following detailed description, which is provided with reference to the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The terms "substrate" and "wafer" are used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

No particular order is required for the method steps described below, with the exception of those logically requiring the results of prior steps. Accordingly, while many of the steps discussed below are discussed as being performed in an exemplary order, this order may be altered.

Figure 1:
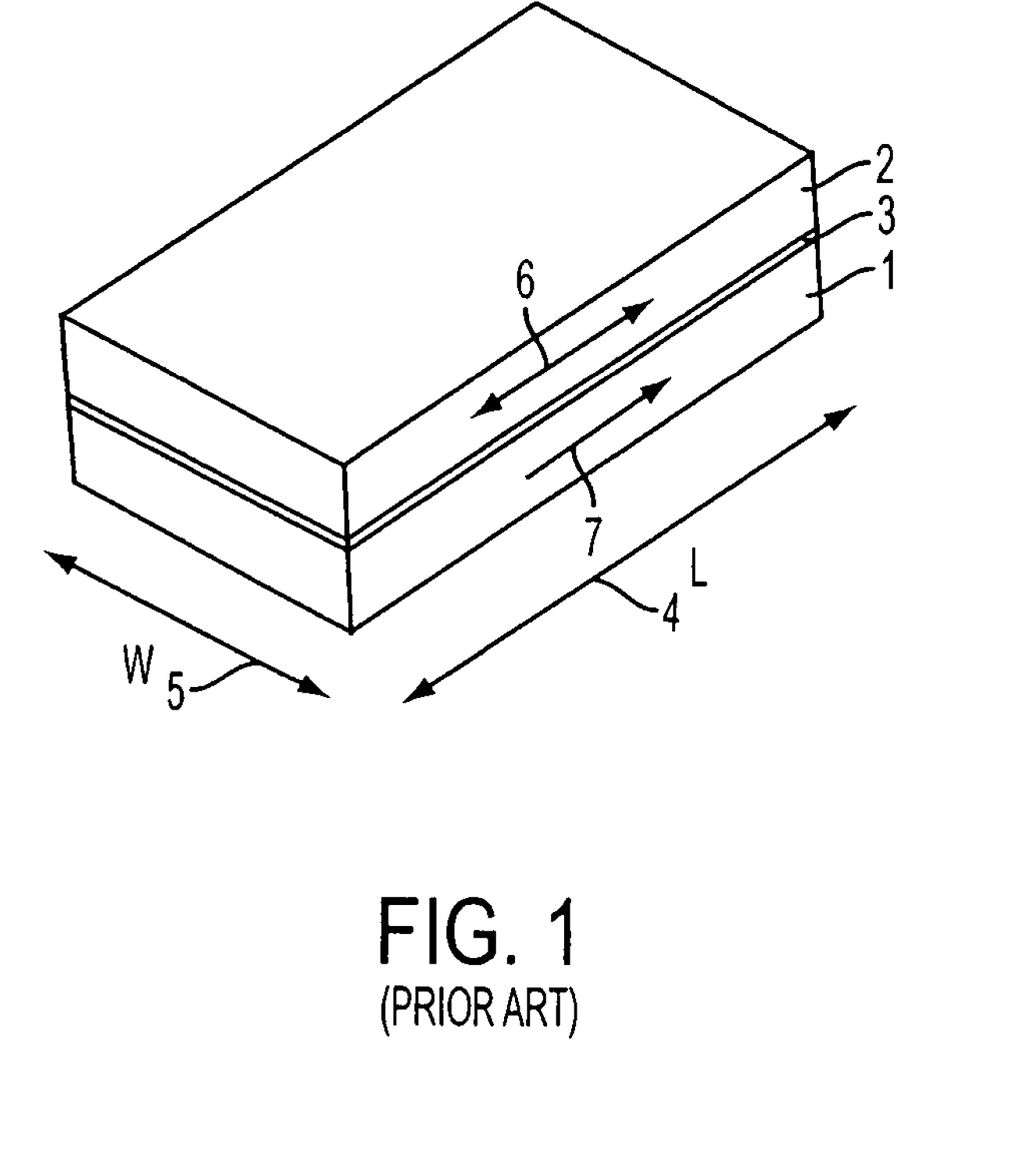
FIG. 1 is a simplified top view of a typical magnetic tunnel junction memory element having a single tunnel barrier layer.

Referring to the drawings where like elements are designated by like reference numerals, FIG. 1 depicts a typical magnetic tunnel junction memory element, known in the art, which has a pinned ferromagnetic layer 1 separated from a free ferromagnetic layer or sense layer 2 by a nonmagnetic tunnel barrier layer 3. The orientation of the magnetic vector of pinned ferromagnetic layer 1 is fixed in one direction along the length 4 of the tunnel junction element, as indicated by single headed arrow 7. The orientation of the magnetic vector of free ferromagnetic or sense layer 2 is free to switch between either of the directions indicated by double-headed arrow 6 when sufficient write field is generated by application of current to the conductors. One direction is parallel to that of the pinned layer and the other is antiparallel. Each direction represents a different resistance state when a current is applied in a direction perpendicular to the planes of the layers. The change in resistance between the two states can be used to produce a signal so that the stored or written information can be read. The resistance change in a structure such as that illustrated in FIG. 1 produces a weak signal which makes reading difficult and sometimes inaccurate.

The present invention provides a magnetic memory element which can be used in an MRAM array, as a magnetic field sensor or read element in a magnetic recording head, or in any suitable application in which a magnetic sensor or MTJ element or cell is desired. The invention provides a double tunnel junction element comprising two pinned ferromagnetic layers, wherein their magnetic orientations are fixed in opposite directions. In a preferred embodiment, the invention includes a sense layer comprising a synthetic ferrimagnet. The present invention has numerous advantages over single tunnel junction devices as well as over multilayered tunnel junction devices known in the art.

Figure 3:
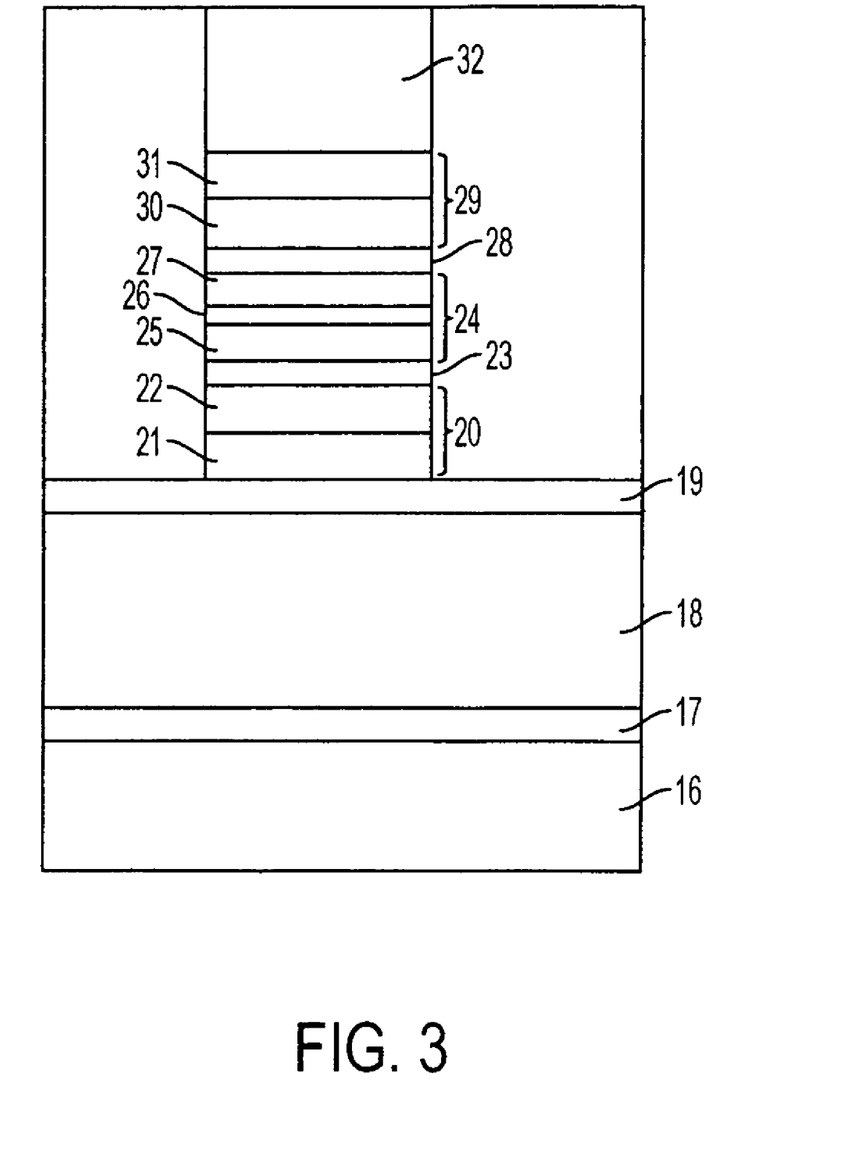
FIG. 3 is a sectional view of an embodiment of the present invention.

FIG. 3 depicts an exemplary magnetic tunnel junction device constructed in accordance with the invention. The device is formed of a series of layers between two conductors 18 and 32, and can be fabricated by any suitable process known to those of skill in the art. Conductor 18 can be composed of conductive materials known in the art, including, without limitation, copper or aluminum. Conductor 18 is insulated from substrate 16 by dielectric insulator layer 17. Substrate 16 may include CMOS circuitry fabricated thereon for operating an array of memory elements. The dielectric insulating layer 17 is preferably TEOS or CVD nitride and preferably about 5000 Angstroms in thickness, although other known insulating materials may also be used. On top of conductor layer 18 is seed layer 19, comprised of a metal suitable for enabling proper crystal growth of antiferromagnetic pinning layer 21, in the illustrated embodiment. Antiferromagnetic materials are known and those suitable for pinning ferromagnetic layer 22 include, without limitation, FeMn, NiMn, PtMn, IrMn, CrAlMn, and PdMn. In the illustrated embodiment, antiferromagnetic pinning layer 21 and ferromagnetic pinned layer 22 comprise pinned layer 20. Ferromagnetic layers 22 and 30 are preferably composed of a transition metal, such as nickel, iron, cobalt, or an alloy of these materials, such as CoFe or NiFe.

Sense layer 24 is separated from pinned layer 20 by tunnel barrier layer 23. Situated on top of sense layer 24 is a second tunnel barrier layer 28, on top of which is a second pinned layer 29, made up of a second antiferromagnetic pinning layer 31 on top of a second pinned ferromagnetic layer 30. Pinned ferromagnetic layers 22 and 30 may be pinned by any suitable means as an alternative to antiferromagnetic coupling. Tunnel barrier layers 23 and 28 are preferably composed of aluminum oxide. In the illustrated embodiment, the sense layer 24 is comprised of ferromagnetic layers 25 and 27, separated by a spacer layer 26.

Figure 4:
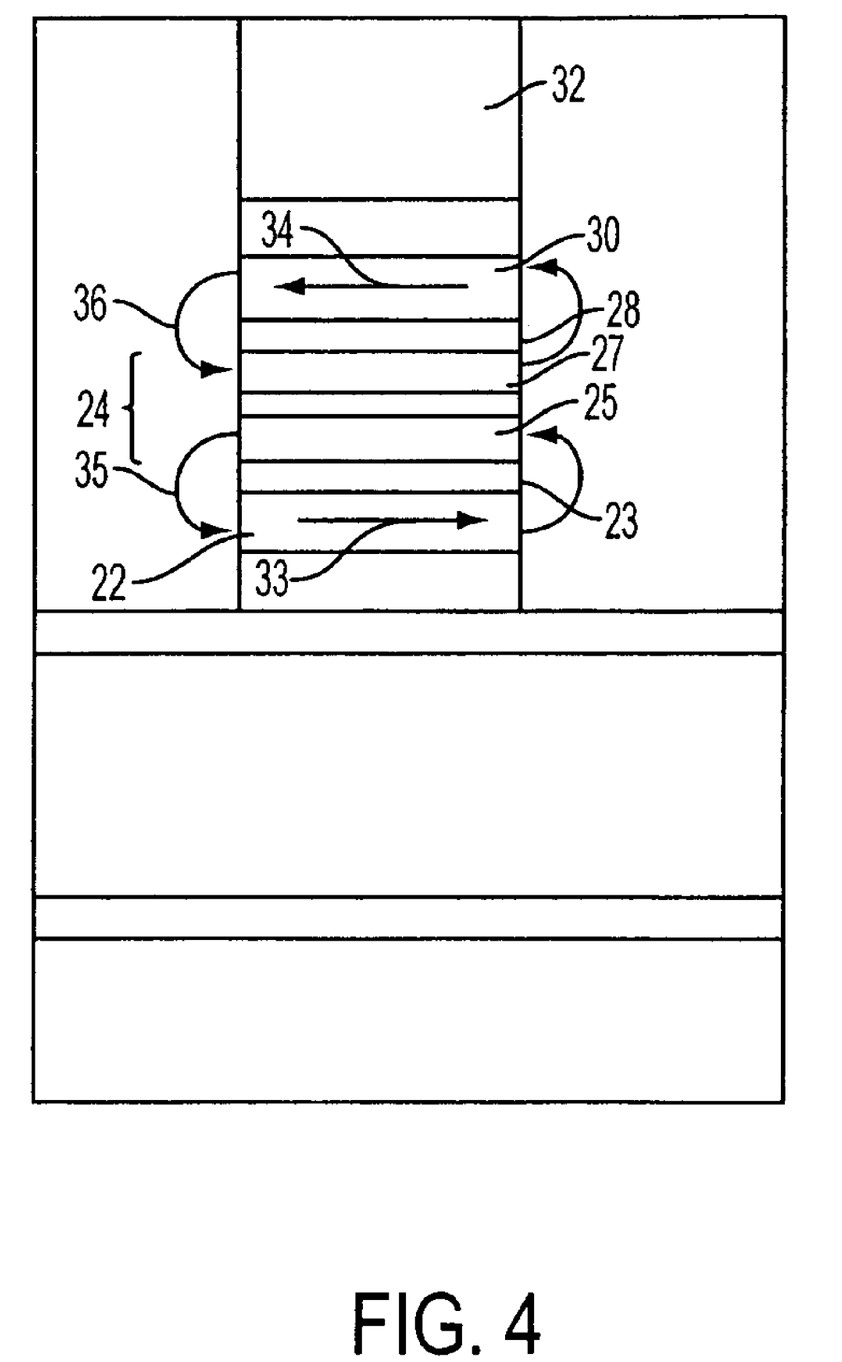
FIG. 4 is a sectional view of an embodiment of the present invention, illustrating the use of oppositely directed magnetic fields in the two pinned layers to compensate the offset field which would otherwise occur at the sense layer.

Referring to FIG. 4, vector 33 represents the magnetization of pinned layer 22 and illustrates that the magnetization is pinned in a specific direction in the plane of pinned ferromagnetic layer 22. Vector 34 represents the magnetization of layer 30 and illustrates that the magnetization is pinned in a specific direction in the plane of layer 30, opposite to that of layer 22. These oppositely directed pinned layers are used to compensate the offset field that would otherwise occur at the sense layer 24 from coupling of the sense layer to a single pinned layer. This compensation effect is illustrated by curved arrows 35 and 36. Thicknesses and moments of ferromagnetic layers 22 and 30 can be chosen to achieve the compensation effect. Moreover, if the roughness of tunnel insulating layers 23 and 28 are similar, Neel coupling fields in the free ferromagnetic layers 25 and 27 will be similar in magnitude, but oppositely directed, so that net Neel coupling will be near zero at the sense layer.

Figure 5A:
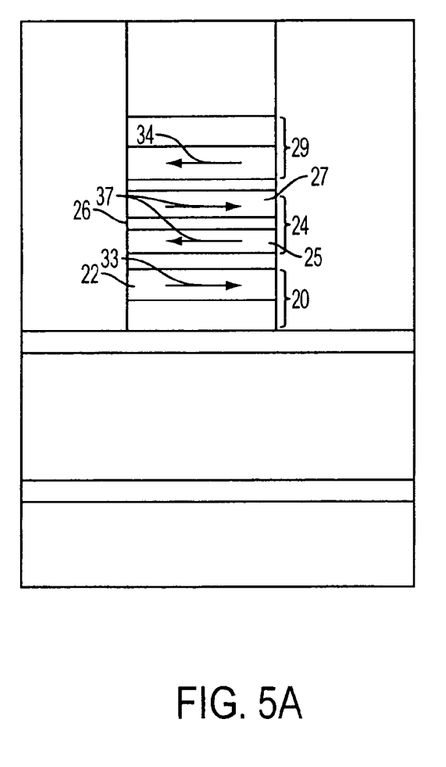
FIG. 5a is a sectional view of an embodiment of the invention showing high resistance during operation.
Figure 5B:
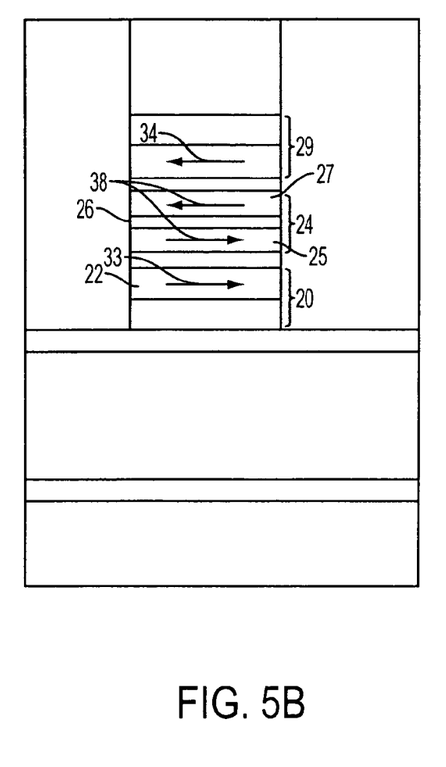
FIG. 5b is a sectional view of an embodiment of the invention showing low resistance during operation.

Referring to FIGS. 5a and 5b, sense layer 24 is preferably a synthetic ferrimagnet comprised of a spacer layer 26 situated between free ferromagnetic layers 25 and 27. Two ferromagnetic layers can be antiferromagnetically coupled, that is, forced to align in opposite directions, by stacking one on top of the other with a thin conductive spacer layer between them. The stack is often referred to as a synthetic ferrimagnet if the net moment of the ferromagnetic layers does not cancel. In the illustrated embodiments, free ferromagnetic layers 25 and 27 are preferably NiFe and spacer layer 26 is preferably Cu or Ru. The spacer layer produces a weak antiferromagnetic coupling between free ferromagnetic layers 25 and 27, which, along with stray fields produced by the free layers 25 and 27, causes the free layers to magnetize in opposite directions. This opposite magnetization reduces the net stray field caused by the free ferromagnetic layers, thus allowing for closer spacing of bits within an array by minimizing bit to bit interactions. In addition, for free ferromagnetic layers 25 and 27 to have a net moment, sense layer 24 must be fabricated so that the moment times thickness of layer 25 is not equal to the moment times thickness of layer 27. The resultant net moment interacts with the fields produced by conductors 18 and 32 so the bit can be written. Moreover, the preferred synthetic ferrimagnet sense layer 24 is fabricated with a greater magnetic volume than a single film sense layer and thus is more stable against thermal fluctuations caused by, for example, superparamagnetic behavior.

FIGS. 5a and 5b further illustrate states of high and low resistance, respectively. Both figures illustrate the synthetic ferrimagnet sense layer 24 having magnetic orientations 37 and 38 oppositely directed and unequal in magnitude, thereby producing a net moment at the sense layer 24. During operation, a sense current is driven through the tunnel junction device in a direction perpendicular to the planes of the illustrated layers from pinned layer 29 to pinned layer 20. The current's resistance is highest when the net moment of sense layer 24 is antiparallel to that of pinned ferromagnetic layer 22 (FIG. 5a) and lowest when the net moment of sense layer 24 is parallel to that of pinned ferromagnetic layer 22 (FIG. 5b). The change in resistance between the two states provides a signal for reading the stored data. In the double tunnel junction structure of the present invention, the resistance change due to tunneling is additive, and therefore the ability to detect it is enhanced to about double that of a single tunnel junction device.

Figure 6:
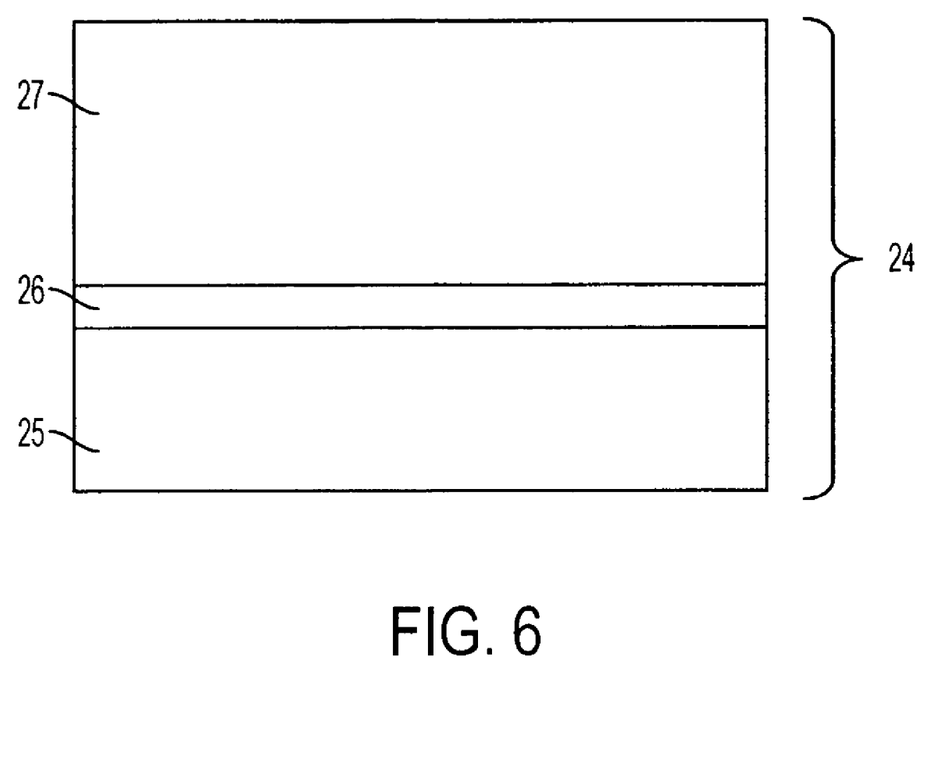
FIG. 6 is a sectional view of a synthetic ferrimagnet sense layer in accordance with the present invention.

FIG. 6 illustrates a preferred synthetic ferrimagnet sense layer 24 in accordance with the invention. This preferred sense layer is the subject of commonly assigned copending U.S. application Ser. No. 10/114,249, filed Apr. 3, 2002, the contents of which are hereby incorporated by reference in their entirety. The thicknesses and materials may be chosen for the layers of a synthetic ferrimagnet structure to achieve the described antiferromagnetic coupling between the two ferromagnetic layers. For example, the spacer layer is of a suitable thickness and composed of a suitable material (e.g. Ru, Cu, or various alloys) so that the antiferromagnetic coupling between the two ferromagnetic layers is of the desired magnitude.

Various ferromagnetic materials or combinations of materials may be chosen to construct a synthetic ferrimagnet suitable for use in the present invention, including without limitation, NiFe, CoFe, Co, Fe, Ni, and NiFeCo. Thickness variations in the spacer layer 26 have a strong effect on the antiferromagnetic coupling of ferromagnetic layers 25 and 27 that occurs across spacer layer 26. Accordingly, depending on the materials and thicknesses selected for ferromagnetic layers 25 and 27, thickness and material of spacer layer 26 may be adjusted or selected to set an appropriate value of the antiferromagnetic coupling of layers 25 and 27. The resulting antiferromagnetic coupling has a desirable value when there is a net moment which does not require a significantly increased switching field. In the illustrated embodiment, ferromagnetic layer 25 is preferably comprised of NiFe and is preferably about 4 nm in thickness. Ferromagnetic layer 27 is preferably comprised of NiFe and is preferably about 6 nm in thickness. The two ferromagnetic layers of sense layer 24 are separated by spacer layer 26, preferably comprised of Ru, and preferably about 1 nm in thickness.

In a preferred embodiment, therefore, the present invention provides a single structure that provides an increased resistance change, exhibits improved thermal stability and is fabricated to allow for increased density in an MRAM array or other suitable application where a memory element is desired in relation to devices currently known in the art.

The magnetic tunnel junction element of the present invention may be fabricated by suitable methods currently known and practiced in the art. A preferred method is by forming layers, one on top of another. For example, the embodiment illustrated in FIG. 3 can be fabricated by providing a substrate, forming an insulating layer over the substrate, forming a first conducting layer over the insulating layer, forming a seed layer over the first conducting layer, forming a first antiferromagnetic layer over the seed layer, forming a first pinned ferromagnetic layer over the first antiferromagnetic layer, in which the first pinned ferromagnetic layer has a magnetic orientation pointing in one direction, forming a first tunnel barrier layer over the first pinned ferromagnetic layer, forming a sense layer over the first tunneling barrier layer, forming a second tunnel barrier layer over the sense layer, forming a second pinned ferromagnetic layer over the second tunnel barrier layer, in which the second ferromagnetic pinned layer has a magnetic orientation pinned in a direction opposite or antiparallel to that of the first pinned layer, forming a second antiferromagnetic pinning layer over the second pinned layer and forming a second write conducting layer over the second antiferromagnetic pinning layer. In a preferred embodiment, the sense layer may be fabricated by forming a third ferromagnetic layer over the first tunnel barrier layer, forming a spacer over the third ferromagnetic layer, and forming fourth ferromagnetic layer over the spacer layer under conditions permitting the two ferromagnetic layers of the sense layer to be antiferromagnetically coupled. The first and second pinned layers preferably include antiferromagnets with different blocking temperatures for setting the pinned layer magnetizations in opposite directions.

Figure 7:
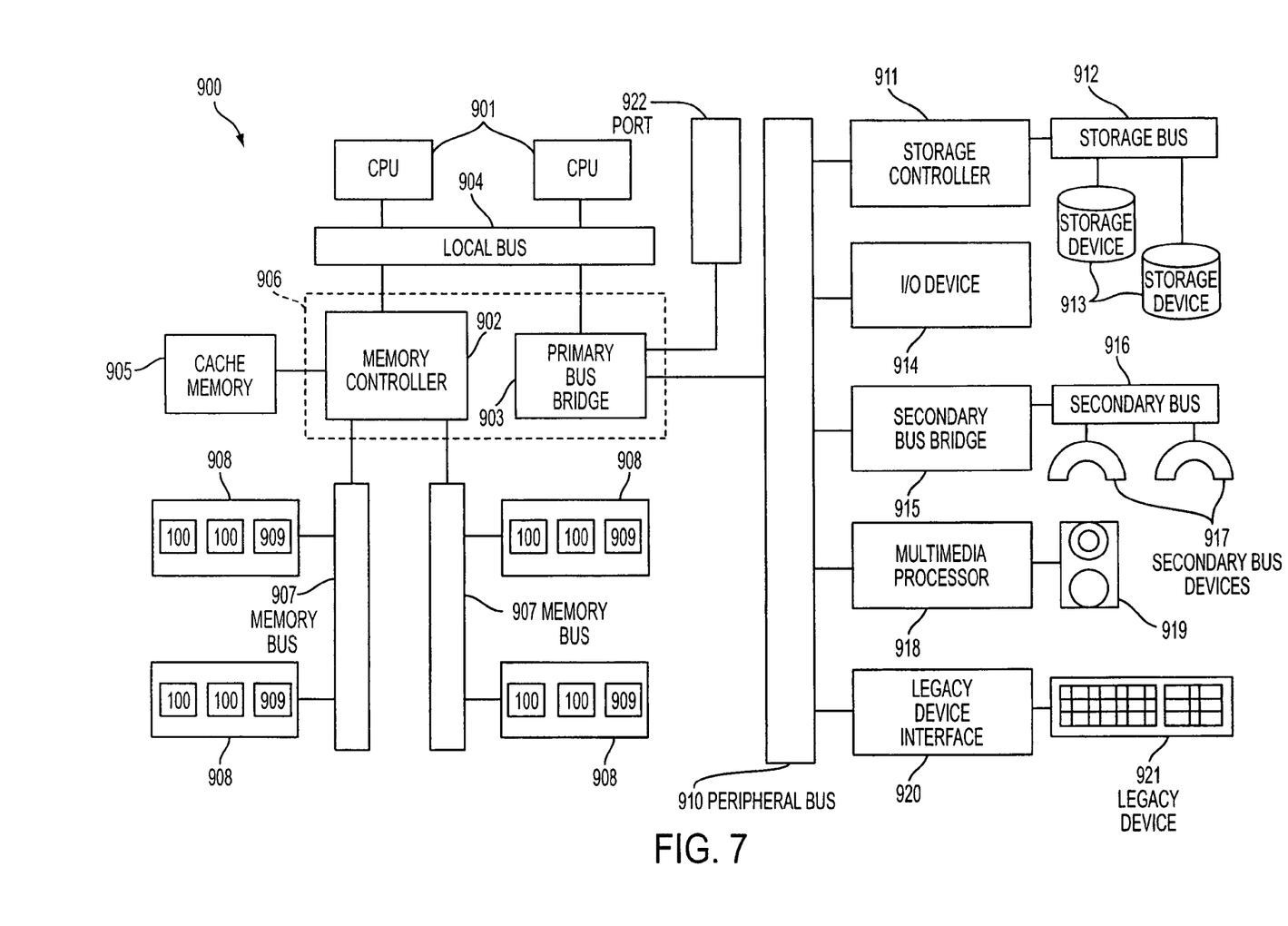
FIG. 7 illustrates a processor system which includes an MRAM memory device in accordance with the present invention.

FIG. 7 illustrates an exemplary processing system 900 which may utilize the memory device 100 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one MRAM memory device 100 incorporates magnetic memory elements as described above with reference to FIGS. 3–6. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 7 is only one exemplary processing system with which the invention may be used. While FIG. 7 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A magnetic tunnel junction device comprising:
   a first conductor;
   a first pinned ferromagnetic layer having a first magnetic orientation in a first direction formed over said first conductor;
   a second pinned ferromagnetic layer having a second magnetic orientation in a second direction, said second direction being substantially opposite to said first direction;
   a sense layer positioned between said first pinned ferromagnetic layer and said second pinned ferromagnetic layer, wherein said sense layer further comprises first and second free ferromagnetic layers separated by a conductive layer, and wherein the conductive layer produces an antiferromagnetic coupling between the first and second free ferromagnetic layers, said first and second free ferromagnetic layers having a net moment that does not cancel one another;
   a first tunnel barrier layer positioned between said first pinned ferromagnetic layer and said sense layer;
   a second tunnel barrier layer positioned between said second pinned ferromagnetic layer and said sense layer; and
   a second conductor formed on said second pinned ferromagnetic layer.

2. The magnetic tunnel junction device of claim 1, wherein said first ferromagnetic pinned layer and said second ferromagnetic pinned layer combine to produce a substantially zero offset switch field at said sense layer.

3. The magnetic tunnel junction device of claim 1, wherein:
   said first pinned ferromagnetic layer includes a first antiferromagnetic layer for pinning said first pinned ferromagnetic layer in said first direction; and said second pinned ferromagnetic layer includes a second antiferromagnetic layer for pinning said second pinned ferromagnetic layer in said second direction.

4. The magnetic tunnel junction device of claim 3, wherein said first antiferromagnetic layer and said second antiferromagnetic layer have different blocking temperatures.

5. The magnetic tunnel junction device of claim 3, wherein said first antiferromagnetic layer comprises a layer of at least one of FeMn, NiMn, PtMn, and IrMn.

6. The magnetic tunnel junction device of claim 3, wherein said second antiferromagnetic layer comprises a layer of at least one of FeMn, NiMn, PtMn, and IrMn.

7. The magnetic tunnel junction device of claim 1, wherein said first tunnel barrier layer comprises aluminum oxide.

8. The magnetic tunnel junction device of claim 1, wherein said second tunnel barrier layer comprises aluminum oxide.

9. The magnetic tunnel junction device of claim 1, wherein each of said first pinned ferromagnetic layer, said second pinned ferromagnetic layer, and said free ferromagnetic layer comprise a transition metal.

10. The magnetic tunnel junction device of claim 9, wherein said transition metal is at least one of nickel, iron, cobalt, and an alloy thereof.

11. The magnetic tunnel junction device of claim 1, wherein said first and second free ferromagnetic layers have unequal moment times thickness properties.

12. A magnetic tunnel junction device comprising:
a first conductor;
a metal seed layer formed over said first conductor;
a first pinned ferromagnetic layer having a first magnetic orientation in a first direction formed over said metal seed layer;
a second pinned ferromagnetic layer having a second magnetic orientation in a second direction, said second direction being substantially opposite to said first direction;
a sense layer provided between said first pinned ferromagnetic layer and said second pinned ferromagnetic layer, said sense layer comprising:
a first free ferromagnetic layer;
a second free ferromagnetic layer; and
a spacer layer positioned between said first and said second free ferromagnetic layers, wherein said spacer layer comprises a conductive material and produces an antiferromagnetic coupling between said first and second free ferromagnetic layers,
wherein said first and said second free ferromagnetic layers are antiferromagnetically coupled and have magnetic orientations opposite in direction and unequal in magnitude, thereby resulting in a net magnetic moment at said sense layer, such that said sense layer can be written with a magnetic field;
a first tunnel barrier layer positioned between said first pinned ferromagnetic layer and said sense layer;
a second tunnel barrier layer positioned between said second pinned ferromagnetic layer and said sense layer; and
a second conductor formed on said second pinned ferromagnetic layer.

13. The magnetic tunnel junction device of claim 12, wherein said first ferromagnetic pinned layer and said second ferromagnetic pinned layer combine to produce a substantially zero offset switch field at said sense layer.

14. The magnetic tunnel junction device of claim 12, wherein:
said first pinned ferromagnetic layer includes a first anti-ferromagnetic layer for pinning said first pinned ferromagnetic layer in said first direction; and
said second pinned ferromagnetic layer includes a second anti-ferromagnetic layer for pinning said second pinned ferromagnetic layer in said second direction.

15. The magnetic tunnel junction device of claim 14, wherein said first antiferromagnetic layer and said second antiferromagnetic layer have different blocking temperatures.

16. The magnetic tunnel junction device of claim 14, wherein said first antiferromagnetic layer comprises a layer of at least one of FeMn, NiMn, PtMn, and IrMn.

17. The magnetic tunnel junction device of claim 14, wherein said second antiferromagnetic layer comprises a layer of at least one of FeMn, NiMn, PtMn, and IrMn.

18. The magnetic tunnel junction device of claim 12, wherein said first tunnel barrier layer comprises aluminum oxide.

19. The magnetic tunnel junction device of claim 12, wherein said second tunnel barrier layer comprises aluminum oxide.

20. The magnetic tunnel junction device of claim 12, wherein each of said first pinned ferromagnetic layer and said second pinned ferromagnetic layer comprise a transition metal.

21. The magnetic tunnel junction device of claim 20, wherein said transition metal is at least one of nickel, iron, cobalt, and an alloy thereof.

22. The magnetic tunnel junction of claim 21, wherein said alloy is nickel iron.

23. The magnetic tunnel junction device of claim 12, wherein said spacer layer comprises Ru.

24. The magnetic tunnel junction device of claim 12, wherein said spacer layer comprises Cu.

25. A method of fabricating a memory device, comprising:
forming an insulating layer over a substrate;
forming a first conducting layer over said insulating layer;
forming a first pinned ferromagnetic layer over said first conducting layer, wherein the first pinned ferromagnetic layer has a magnetic orientation in a first direction;
forming a first tunnel barrier layer over said first pinned ferromagnetic layer;
forming a sense layer over said first tunnel barrier layer, wherein said step of forming the sense layer further comprises the steps:
forming first and second free ferromagnetic layers each having corresponding first and second magnetic orientations and magnitudes such that a net moment exists therebetween;
forming a conductive layer between said first and second free ferromagnetic layers that produces an antiferromagnetic coupling between the first and second free ferromagnetic layers;
forming a second tunnel barrier layer over said sense layer;
forming a second pinned ferromagnetic layer over said second tunnel barrier layer, wherein said second ferromagnetic pinned layer has a second magnetic orientation pinned in a direction opposite to that of said first pinned layer; and
forming a second conducting layer on said second pinned ferromagnetic layer.

26. The method of claim 25, wherein said first conducting layer comprises copper or aluminum.

27. The method of claim 25, wherein said second conducting layer comprises copper or aluminum.

28. The method of claim 25, wherein said first tunnel barrier layer comprises aluminum oxide.

29. The method of claim 25, wherein said second tunnel barrier layer comprises aluminum oxide.

30. The method of claim 25, wherein each of said first pinned ferromagnetic layer and said second pinned ferromagnetic layer comprise a transition metal.

31. The method of claim 30, wherein said transition metal is at least one of nickel, iron, cobalt, and an alloy thereof.

32. The method of claim 31, wherein said alloy thereof is nickel iron.

33. The method of claim 25, wherein said conductive layer comprises Ru.

34. The method of claim 25, wherein said conductive layer comprises Cu.

35. A processor system comprising:
a processor; and
a magnetoresistive memory device coupled to exchange data with said processor, said magnetoresistive memory device comprising:
at least one magnetic tunnel junction memory element, said memory element comprising:
a first conductor;
a first pinned ferromagnetic layer having a first magnetic orientation in a first direction formed over said first conductor;
a second pinned ferromagnetic layer having a second magnetic orientation in a second direction, said second direction being substantially opposite to said first direction;
a sense layer positioned between said first pinned ferromagnetic layer and said second pinned ferromagnetic layer, wherein said sense layer further comprises first and second free ferromagnetic layers separated by a conductive layer, and wherein the conductive layer produces an antiferromagnetic coupling between the first and second free ferromagnetic layers and said first and second free ferromagnetic layers have magnetic orientations of unequal magnitude;
a first tunnel barrier layer positioned between said first pinned ferromagnetic layer and said sense layer;
a second tunnel barrier layer positioned between said second pinned ferromagnetic layer and said sense layer; and
a second conductor formed on said second pinned ferromagnetic layer.

36. The processor system of claim 35, wherein said first ferromagnetic pinned layer and said second ferromagnetic pinned layer combine to produce a substantially zero offset switch field at said sense layer.

37. The processor system of claim 35, wherein:
said first pinned ferromagnetic layer includes a first anti-ferromagnetic layer for pinning said first pinned ferromagnetic layer in said first direction; and
said second pinned ferromagnetic layer includes a second anti-ferromagnetic layer for pinning said second pinned ferromagnetic layer in said second direction.

38. The processor system of claim 37, wherein said first antiferromagnetic layer and said second antiferromagnetic layer have different blocking temperatures.

39. The processor system of claim 37, wherein said first antiferromagnetic layer comprises a layer of at least one of FeMn, NiMn, PtMn, and IrMn.

40. The processor system of claim 37, wherein said second antiferromagnetic layer comprises a layer of at least one of FeMn, NiMn, PtMn, and IrMn.

41. The processor system of claim 35, wherein said first tunnel barrier layer comprises aluminum oxide.

42. The processor system of claim 35, wherein said second tunnel baffler layer comprises aluminum oxide.

43. The processor system of claim 35, wherein each of said first pinned ferromagnetic layer, said second pinned ferromagnetic layer, and said free ferromagnetic layer comprise a transition metal.

44. The processor system of claim 43, wherein said transition metal is at least one of nickel, iron, cobalt, and an alloy thereof.

45. A processor system comprising:
a processor; and
a magnetoresistive memory device coupled to exchange data with said processor, said magnetoresistive memory device comprising at least one magnetic tunnel junction memory element, said memory element comprising:
a first conductor;
a metal seed layer formed over said first conductor;
a first pinned ferromagnetic layer having a first magnetic orientation in a first direction formed over said metal seed layer;
a second pinned ferromagnetic layer having a second magnetic orientation in a second direction, said second direction being substantially opposite to said first direction;
a sense layer provided between said first pinned ferromagnetic layer and said second pinned ferromagnetic layer, said sense layer comprising:
a first free ferromagnetic layer;
a second free ferromagnetic layer; and
a spacer layer positioned between said first and said second free ferromagnetic layers, wherein said spacer layer comprises a conductive material and produces an antiferromagnetic coupling between said first and second free ferromagnetic layers, wherein said first and said second free ferromagnetic layers are antiferromagnetically coupled and have magnetic orientations opposite in direction and unequal in magnitude, thereby resulting in a net magnetic moment at said sense layer, such that the sense layer can be written with a magnetic field;
a first tunnel barrier layer positioned between said first pinned ferromagnetic layer and said sense layer;
a second tunnel barrier layer positioned between said second pinned ferromagnetic layer and said sense layer; and
a second conductor formed on said second pinned ferromagnetic layer.

46. The processor system of claim 45, wherein said first ferromagnetic pinned layer and said second ferromagnetic pinned layer combine to produce a substantially zero offset switch field at said sense layer.

47. The processor system of claim 45, wherein:
said first pinned ferromagnetic layer includes a first anti-ferromagnetic layer for pinning said first pinned ferromagnetic layer in said first direction; and
said second pinned ferromagnetic layer includes a second anti-ferromagnetic layer for pinning said second pinned ferromagnetic layer in said second direction.

48. The processor system of claim 47, wherein said first antiferromagnetic layer and said second antiferromagnetic layer have different blocking temperatures.

49. The processor system of claim 47, wherein said first antiferromagnetic layer comprises a layer of at least one of FeMn, NiMn, PtMn, and IrMn.

50. The processor system of claim 47, wherein said second antiferromagnetic layer comprises a layer of at least one of FeMn, NiMn, PtMn, or IrMn.

51. The processor system of claim 45, wherein said first tunnel barrier layer comprises aluminum oxide.

52. The processor system of claim 45, wherein said second tunnel barrier layer comprises aluminum oxide.

53. The processor system of claim 45, wherein each of said first pinned ferromagnetic layer and said second pinned ferromagnetic layer comprise a transition metal.

54. The processor system of claim 53, wherein said transition metal is at least one of nickel, iron, cobalt, and an alloy thereof.

55. The processor system of claim 54, wherein said alloy is nickel iron.

56. The processor system of claim 45, wherein said spacer layer comprises Ru.

57. The processor system of claim 45, wherein said spacer layer comprises Cu.

58. A magnetoresistive memory device comprising:
a first conductor;
a metal seed layer formed over said first conductor;
a first pinned ferromagnetic layer comprising NiFe and having a first magnetic orientation in a first direction formed over said metal seed layer;
a second pinned ferromagnetic layer comprising NiFe and having a second magnetic orientation in a second direction, said second direction being substantially opposite to said first direction;
a synthetic ferrimagnet sense layer provided between said first pinned ferromagnetic layer and said second pinned ferromagnetic layer,
wherein said synthetic ferrimagnet sense layer further comprises first and second free ferromagnetic layers which are antiferromagnetically coupled and have magnetic orientations opposite in direction and unequal in magnitude, thereby resulting in a net magnetic moment at said synthetic ferrimagnet sense layer, wherein a spacer layer comprising a conductive material is formed between said first and second free ferromagnetic layers;
a first tunnel barrier layer comprising aluminum oxide positioned between said first pinned ferromagnetic layer and said synthetic ferrimagnet sense layer;
a second tunnel barrier layer comprising aluminum oxide positioned between said second pinned ferromagnetic layer and said synthetic ferrimagnet sense layer; and
a second conductor formed on said second pinned ferromagnetic layer.

59. The magnetoresistive memory device of claim 58, wherein said synthetic ferrimagnet sense layer comprises:
a first free ferromagnetic layer comprising NiFe and having a thickness of 6 nm;
a second free ferromagnetic layer comprising NiFe and having a thickness of 4 nm; and
a spacer layer comprising Ru, having a thickness of 1 nm, and positioned between said first and said second free ferromagnetic layers.

60. A method of fabricating a memory device, said method comprising:
forming an insulating layer over a substrate;
forming a first conducting layer comprising copper over said insulating layer;
forming a metal seed layer over said first conducting layer;
forming a first pinned ferromagnetic layer comprising nickel iron over said metal seed layer, wherein said first pinned ferromagnetic layer has a magnetic orientation in a first direction;
forming a first tunnel barrier layer comprising aluminum oxide over said first pinned ferromagnetic layer;
forming a sense layer over said first tunnel barrier layer, wherein said sense layer further comprises first and second free ferromagnetic layers separated by a conductive layer, the conductive layer produces an antiferromagnetic coupling between the first and second free ferromagnetic layers, and said first and second free ferromagnetic layers have magnetic orientations of unequal magnitude;
forming a second pinned ferromagnetic layer comprising nickel iron over a second tunnel barrier layer, wherein said second ferromagnetic pinned layer has a second magnetic orientation pinned in a direction opposite to that of said first pinned layer; and
forming a second conducting layer comprising copper on said second pinned ferromagnetic layer, wherein the sense layer is fabricated by:
forming a third ferromagnetic layer over said first tunnel barrier layer;
forming a spacer layer over said third ferromagnetic layer; and
forming a fourth ferromagnetic layer over said spacer layer in a manner such that said fourth ferromagnetic layer and said third ferromagnetic layer are antiferromagnetically coupled.

* * * * *

UNITED STATES PATENT AND TRADEMARK OFFICE
CERTIFICATE OF CORRECTION

| | |
|---|---|
| PATENT NO. | : 7,196,882 B2 |
| APPLICATION NO. | : 10/200512 |
| DATED | : March 27, 2007 |
| INVENTOR(S) | : James G. Deak |

It is certified that error appears in the above-identified patent and that said Letters Patent is hereby corrected as shown below:

In the Specification, the following errors are corrected:

Column 7:

Lines 10-11, "coupled the" should read --coupled to the--;

Line 32, "include" should read --includes--;

Lines 43-44, "an miscellaneous" should read --a miscellaneous--;

Line 45, "an legacy" should read --a legacy--;

Line 46, "also coupled" should read --also be coupled--;

Line 56, "an local" should read --a local--;

Line 60, "an universal" should read --a universal--;

Line 61, "via to the" should read --via the--; and

Line 64, "to one additional" should read --to additional--.

Column 8:

Line 15, "system" should read --systems--.

Signed and Sealed this

Twelfth Day of June, 2007

JON W. DUDAS
*Director of the United States Patent and Trademark Office*